United States Patent

Lei et al.

[11] Patent Number: 5,968,276
[45] Date of Patent: Oct. 19, 1999

[54] HEAT EXCHANGE PASSAGE CONNECTION

[75] Inventors: Lawrence Lei, Milpitas; Son Trinh, Cupertino; Mark Johnson, San Jose, all of Calif.

[73] Assignee: Applied Materials, Inc., Santa Clara, Calif.

[21] Appl. No.: 08/893,859

[22] Filed: Jul. 11, 1997

[51] Int. Cl.[6] .................................................. C23C 16/00
[52] U.S. Cl. .................... 118/723 R; 118/723 I; 118/723 E; 118/723 HC; 118/723 MP; 118/724; 204/298.07; 204/298.09; 204/298.33; 422/198; 422/200
[58] Field of Search .............................. 118/58, 69, 723 I, 118/723 E, 723 HC, 723 MP, 723 R, 724; 427/561, 585, 587, 588, 593; 204/298.07, 298.09, 298.33; 422/198, 200; 165/158

[56] References Cited

U.S. PATENT DOCUMENTS 4,859,304  8/1989  Cathey et al. .
5,595,606  1/1997  Fujikawa et al. ........................ 118/724
5,725,675  3/1998  Fong et al. ............................ 118/723 E Primary Examiner—Peter Chin
Assistant Examiner—Michael P. Colaianni
Attorney, Agent, or Firm—Thomason Moser & Patterson

[57] ABSTRACT

The present invention provides a method and apparatus for improving thermal management of gas being delivered to a chemical vapor deposition chamber. Thermal management is accomplished using a heat transfer fluid in thermal communication with the deposition gas passageways delivering the gases to the chamber for deposition. The gas injection manifold includes gas passageways and coolant liquid passageways, wherein the gas passageways extend through a constant voltage gradient gas feedthrough and the coolant liquid passageways extend through a gas input manifold coupled to the inlet end of the constant voltage gradient gas feedthrough. This arrangement provides for increase coolant liquid flow and allows maintenance or disassembly of the constant voltage gradient gas feedthrough without breaking the seal on the coolant liquid system.

13 Claims, 6 Drawing Sheets

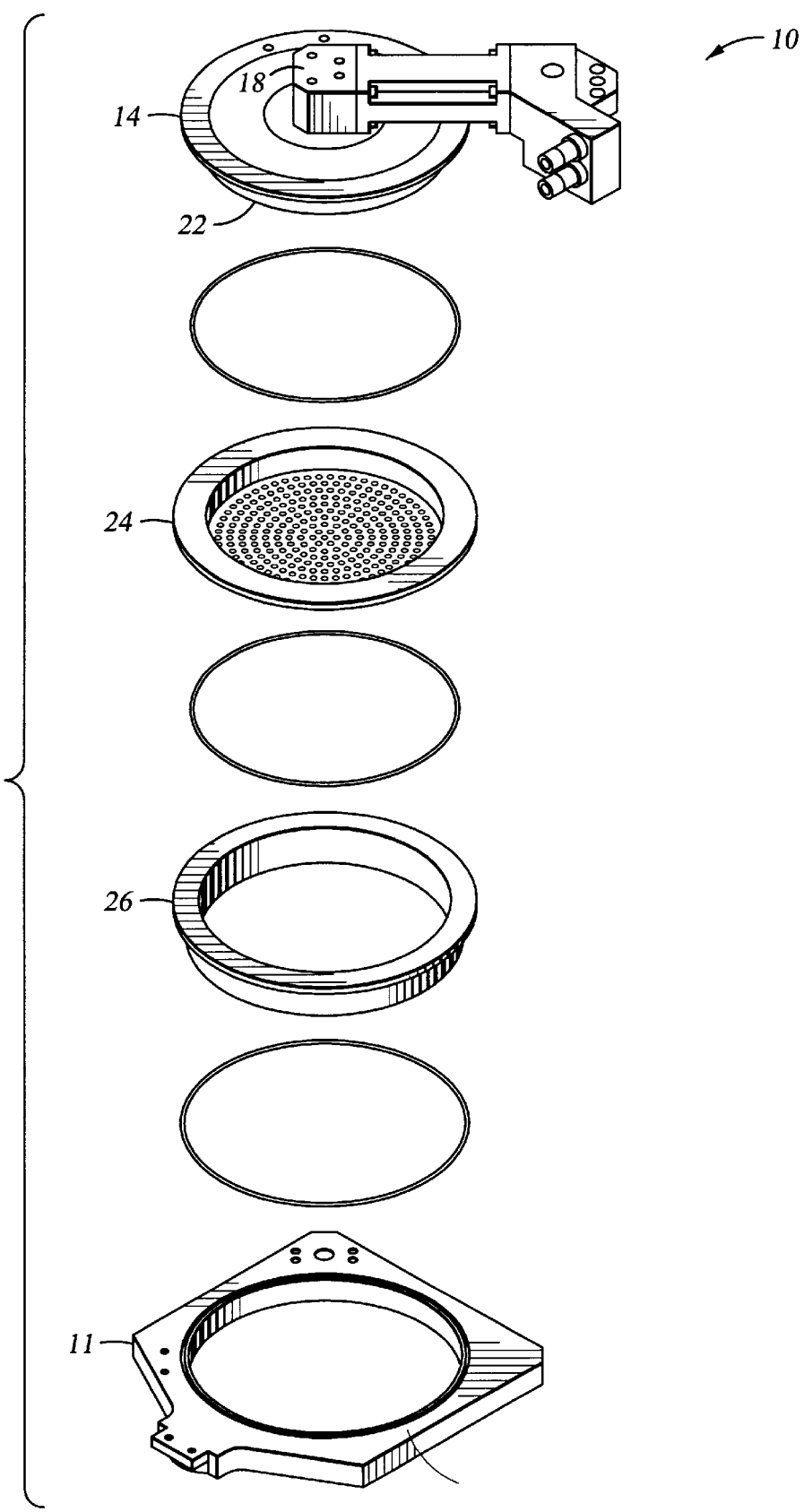

HEAT EXCHANGE PASSAGE CONNECTION

BACKGROUND OF THE INVENTION

1. Field of the Invention

The present invention relates generally to gas distribution plates utilized in semiconductor wafer processing equipment, and more particularly to a liquid cooled gas distribution plate for use in a chemical vapor deposition chamber.

2. Background of the Related Art

Gas distribution plates are commonly utilized in chemical vapor deposition (CVD) chambers to distribute gases uniformly as they are introduced into the chamber. Uniform gas distribution is necessary to achieve uniform deposition characteristics upon the surface of a wafer located within the chamber.

Problems have arisen in utilizing the currently available gas distribution plates when the temperature of the plate causes problems in handling a gas or gas mixture, such as unwanted reactions between components of the deposition gas. Thermal management of the deposition gas may be necessary or desirable in any process that utilizes gases, including TEOS, silane, tungsten, tungsten silicide, titanium nitride, aluminum, copper, titanium, sub-atmospheric CVD processes and the like.

For example, to deposit a layer of tungsten silicide by chemical vapor deposition, tungsten hexafluoride and silane, are input through a gas manifold and mixed in a water cooled gas mixing chamber within the gas manifold head. The two reactant gases must be kept cool, because the two gases will react to form a solid, tungsten silicide, at temperatures greater than approximately 25 degrees centigrade. After mixing the reactant gases in the cooled gas manifold head, the gaseous mixture is passed through a standard gas distribution plate system, whereby a uniform distribution of the gaseous mixture is introduced into the deposition chamber. The gaseous mixture then impinges upon a wafer within the chamber, whereupon the two gases react to deposit tungsten silicide on the wafer.

Particulate contamination problems have occurred in the above described systems when the prior art gas distribution plate has warmed to temperatures greater than 25 degrees centigrade. When such plate warming occurs, the two gases react at the gas distribution plate to form large particulates that can contaminate the wafer. Furthermore, at temperatures greater than about 25 degrees centigrade, deposits may form and clog the gas distribution holes of the plate to cause uneven deposition. Additionally, a layer of tungsten silicide may form on the inner surface of the plate and later flake off in large particulates which rain down upon the wafer to create an uneven tungsten silicide layer, whereby the wafer is contaminated and rendered valueless.

FIG. 1 is a perspective view of a system 10 including a pumping plate or lid 11 for a commercially available chemical vapor deposition chamber. The pumping plate 11 includes a gas injection manifold 12 and a gas box 14. The gas injection manifold 12 typically includes a gas input manifold 16 which communicates with a gas source, a gas output manifold 18 which communicates with the gas box 14, and a constant voltage gradient gas feedthrough 20 disposed therebetween.

FIG. 2 is an exploded view of the gas box 14 of FIG. 1 which is RF hot and routes process gas from the gas output manifold 18 to the blocker plate 22. The blocker plate 22, in turn, channels process gas to the gas distribution plate 24 where the gases are evenly distributed over the wafer through hundreds of holes. An isolator 26 is disposed between the "RF hot" gas distribution plate 24 and the "electrically grounded" chamber lid 11.

FIG. 3 is a cross-sectional view of the gas injection manifold 12 shown in FIG. 1 that channels process gases from the chamber body gas feedthrough line (not shown) into the gas box 14 (See FIG. 2). The gas injection manifold 12 generally comprises a gas input manifold 16, a gas output manifold 18 and a constant voltage gradient feedthrough 20 disposed therebetween. The gas input manifold 16 and the gas output manifold 18 are typically made of a metal, whereas the constant voltage gradient feedthrough 20 includes an electrically insulative housing 22, such as quartz or polytetrafluoroethylene (PTFE, available under the trademark TEFLON from DuPont de Nemour & Company of Wilmington, Del. Gas feed tubes 24 extend from the gas input manifold 16, through the constant voltage feedthrough 20, to the gas output manifold 18. A ceramic resistor tube 26 is disposed around the gas feed tubes 24 to provide the constant voltage gradient between the RF hot gas output manifold 18 and the electrically grounded gas input manifold 16.

The electrically insulative housing 22 is also provided with a pair of water-carrying channels or passages 28 adjacent the passages 30 which receive the gas feed tubes 24. The water-carrying channels 28 include a water input channel and a water output channel for transporting water to and from the gas input manifold 16 and a coolant pool or channel (not shown) within the chamber lid assembly 10. The coolant pool or channel allows water to heat or cool various parts of the lid assembly 10. Furthermore, water passing through the water-carrying channels 28 may be used to provide thermal management of gases passing through the gas feed tubes 24. Typically, water will be withdrawn through the water output channel and recycled to a heat exchange system (not shown) that controls the temperature of the water.

FIG. 4 is a gas delivery system that incorporates the gas injection manifold 12 of FIG. 3. The reactant gases are passed through the gas input manifold 16, the gas feed tube(s) 24 of the constant voltage gradient feedthrough 20 and the gas output manifold 18 before being released into the gas box 14 of the chemical vapor deposition chamber. The gases are cooled by passing a liquid coolant through the gas input manifold 16, a first liquid channel 28 of the feedthrough 20, the gas output manifold 18 and into the liquid coolant pool 32 adjacent the gas box 14 before returning the liquid through the gas output manifold 18, a second liquid channel 28 of the feedthrough 20, and the gas input manifold 16. The coolant liquid exiting the gas input manifold 16 may be returned to a central or dedicated heat exchange system or passed to another device or chamber for further cooling.

However, the system described above in reference to FIGS. 1–4 suffers from several operational limitations. First, it is necessary to clean the gas passageways of the gas injection manifold 12 periodically due to the buildup of particulate contaminants therein. To facilitate thorough cleaning, the gas injection manifold must be disassembled. However, when the electrically insulative housing 20 is loosened and removed from the gas input and output manifolds 16, 18, the water-carrying passageways 28 are consequently opened, thereby allowing water to spill on or around the equipment. While it may be possible to minimize the amount of water spilled by evacuating the water channels 28 prior to disassembly, these measures are wholly unproductive because the water channels do not typically require cleaning. Furthermore, the seals between the reassembled housing 20 and gas input and output manifolds 16, 18 that communicate with the water channels 20 must be checked for leaks following the maintenance procedure.

Another limitation of the prior art arrangement is that the electrically insulating housing, ceramic resistors and feed tubes are typically made from materials having low thermal conductivities. Consequently, the transfer of thermal energy between fluids is quite low.

Furthermore, passing the heat exchange fluid through the electrically insulative housing imposes certain constraints on the diameter of the water-carrying channels and, therefore, the water flow rate and pressure drop through the system.

FIG. 5 is an alternative heat exchange system 40 which overcomes several of the limitations stated above with regard to system 10 by providing flexible water coolant fluid tubes 42, 44 directly to and from the coolant pool 32. However, this alternative system 40 does not allow for thermal management of the gas injection manifold 16 and, therefore, is not suitable for use with certain processes, such as deposition of tungsten silicide as described above.

Therefore, there is a need for a chemical vapor deposition chamber having improved thermal management over the gas injection manifold and gas box. There is also a need for a gas injection manifold providing improved heat exchange between a heat exchange fluid and the process gases entering the chamber. It would be desirable if the gas injection manifold allowed the water cooling system to remain closed during maintenance and cleaning of the manifold, thereby simplifying the cleaning procedure and avoiding spills. It would be further desirable if the system allowed higher water flow rates and a lower pressure drop across the chamber.

SUMMARY OF THE INVENTION

The present invention provides a method and apparatus for improving thermal management of gases being delivered to a chemical vapor deposition chamber. Thermal management is accomplished using a heat transfer fluid in thermal communication with the deposition gas passageways delivering the gases to the chamber for deposition.

One aspect of the invention provides a gas injection manifold having gas passageways and coolant liquid passageways wherein the gas passageways extend through a constant voltage gradient gas feedthrough and the coolant liquid passageways extend only through a gas input manifold coupled to the inlet end of the constant voltage gradient gas feedthrough. The gas input manifold is made from a material having a high thermal conductivity such as a metal. In this manner, heat transferred between the coolant fluid and the gas can be optimized.

Another aspect of the invention provides a coolant liquid system for a gas injection manifold which remains intact during maintenance and disassembly of the gas injection manifold, particularly the constant voltage gradient gas feedthrough. This is accomplished primarily by providing a self-contained heat exchanger within the gas input manifold. The gas input manifold is provided with separate liquid coolant inlet and liquid coolant outlet. It should also be recognized that the gas input manifold just described will also allow maintenance or disassembly of the coolant liquid system without requiring disassembly of the gas injection manifold.

A further aspect of the invention provides for cooling of the gas injection manifold and the gas box or the gas distribution plate, without passing the coolant fluid through the constant voltage gradient gas feedthrough. Heat exchange passages through the gas input manifold as well as the coolant liquid pool or channel within the gas box or gas distribution plate may be operated in series or in parallel. The passages may comprise: holes drilled through the member, such as through the gas input manifold in close proximity to the gas passages; a chamber defined between two parallel plates, such as adjacent the gas box; or a sealed annular groove, such as in the wall surrounding the gas distribution plate. Flexible tubing, such as plastic or rubber hose, may be used to deliver and transfer the coolant fluid to and between passages.

Each of the cooling systems of the present invention provide improved thermal management of gas delivery systems to chemical vapor deposition chambers. Thermal management or temperature control of the gases is often necessary or desirable to prevent side reactions or undesirable deposition within the gas delivery system.

In yet another aspect of the invention, a gas injection manifold having a gas input manifold, a constant voltage gradient passthrough and a gas output manifold are provided with a cooling liquid passage through the gas input manifold and a bypass member coupled to the coolant liquid passage for bypassing the constant voltage gradient gas feedthrough. This bypassing member allows maintenance and disassembly of the constant voltage gradient gas feedthrough without breaking the seal on the coolant liquid system. In one embodiment, the bypass has a second end coupled to a coolant pool in the gas box or a channel in the gas distribution plate.

BRIEF DESCRIPTION OF THE DRAWINGS

So that the above recited features and advantages of the present invention can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a expanded diagram depicting the components of the gas distribution system of the lid depicted in FIG. 1;

DETAILED DESCRIPTION OF THE PREFERRED EMBODIMENT

The present invention provides a method and apparatus for improving thermal management of gases being delivered to a chemical vapor deposition chamber. Thermal management is accomplished using a heat transfer fluid in thermal communication with the deposition gas passageways delivering the gases to the chamber for deposition.

One aspect of the invention provides a gas injection manifold having gas passageways and coolant liquid passageways wherein the gas passageways extend through a constant voltage gradient gas feedthrough and the coolant liquid passageways extend only through a gas input manifold coupled to the inlet end of the constant voltage gradient gas feedthrough. The gas input manifold is made from a material having a high thermal conductivity such as a metal. In this manner, heat transferred between the coolant fluid and the gas can be optimized.

Another aspect of the invention provides a coolant liquid system for a gas injection manifold which remains intact during maintenance and disassembly of the gas injection manifold, particularly the constant voltage gradient gas feedthrough. This is accomplished primarily by providing a self-contained heat exchanger within the gas input manifold. The gas input manifold is provided with separate liquid coolant inlet and liquid coolant outlet. It should also be recognized that the gas input manifold just described will also allow maintenance or disassembly of the coolant liquid system without requiring disassembly of the gas injection manifold.

A further aspect of the invention provides for cooling of the gas injection manifold and the gas box or the gas distribution plate, without passing the coolant fluid through the constant voltage gradient gas feedthrough. Heat exchange passages through the gas input manifold and the coolant liquid pool or channel within the gas box or gas distribution plate may be operated in series or in parallel.

Figure 8:
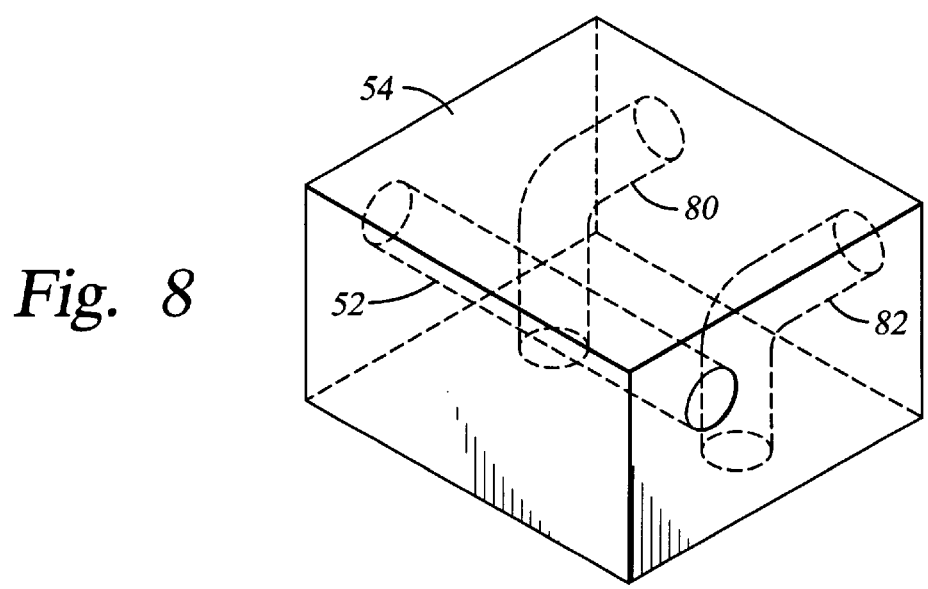
FIG. 8 is a schematic perspective view showing the gas input manifold with gas passages and a coolant liquid passage therethrough.
Figure 3:
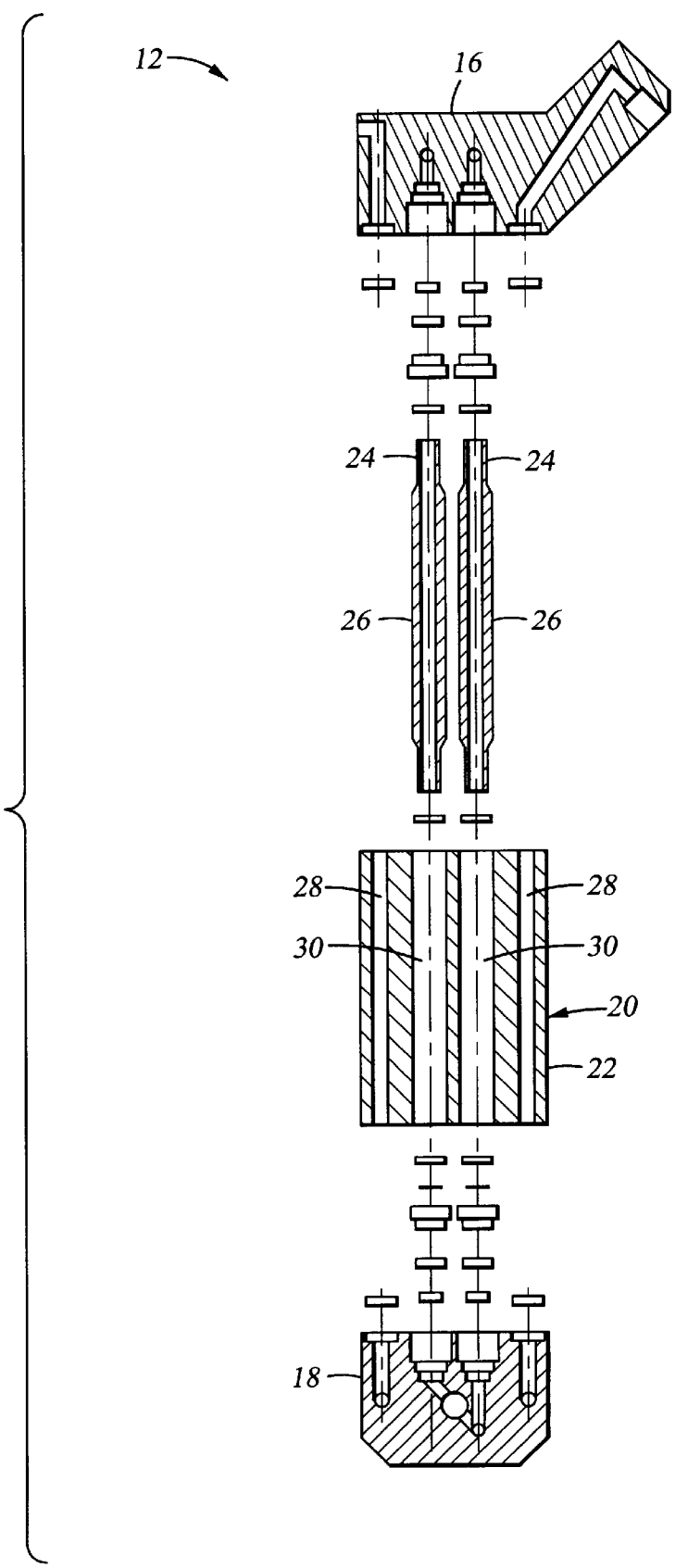
FIG. 3 is a cross-sectional view of the gas injection manifold.
Figure 4:
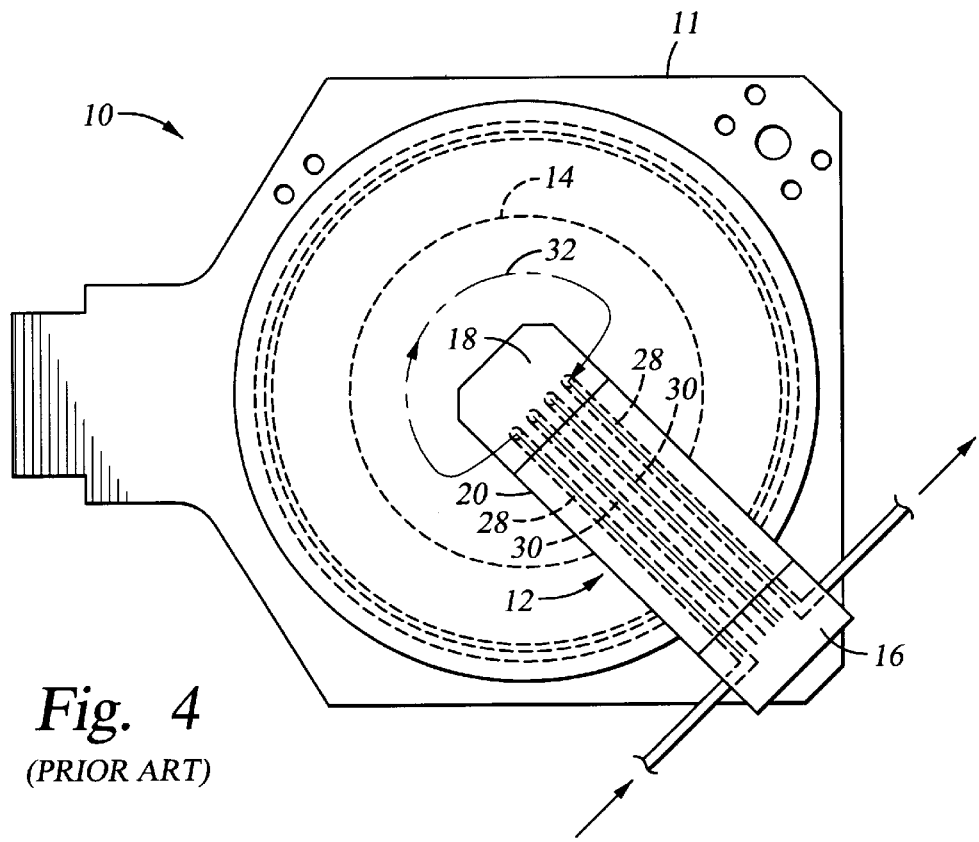
FIG. 4 is a schematic flow diagram of a gas delivery system including the gas injection manifold of FIG. 3.
Figure 5:
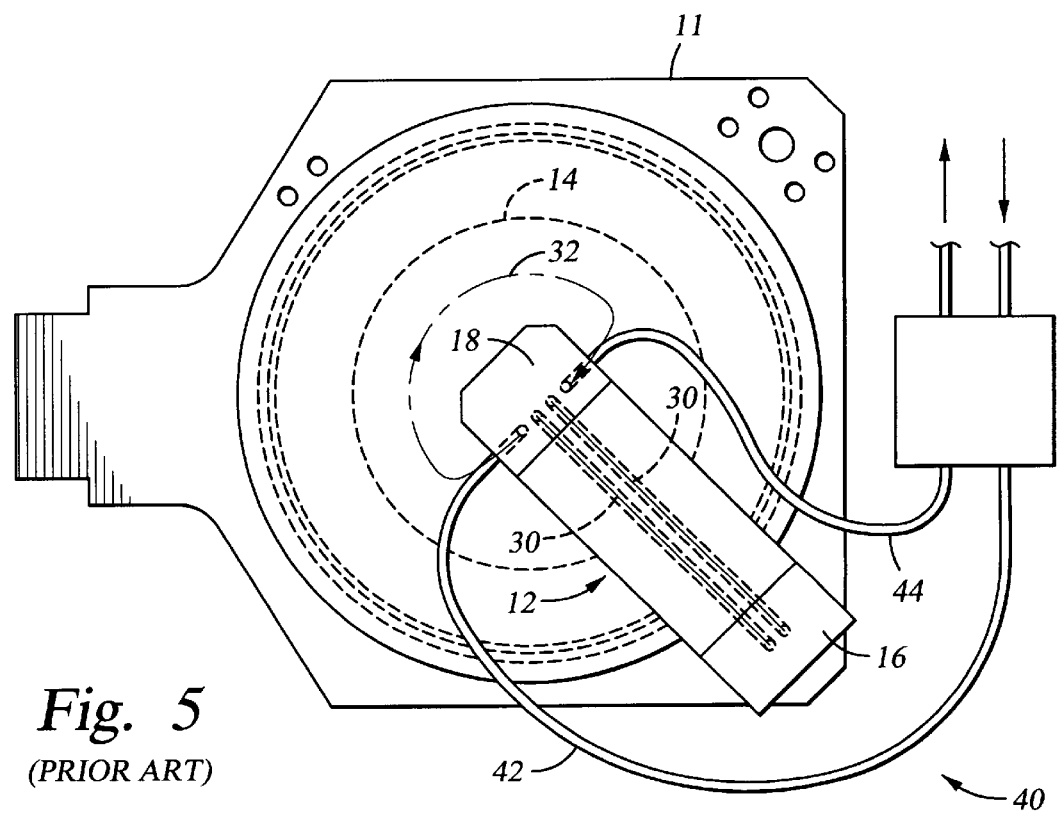
FIG. 5 is a schematic flow diagram of another gas delivery system including a gas injection manifold without liquid coolant passages.

FIG. 8 is a schematic perspective view showing the gas input manifold 54 with gas passages 80, 82 and a coolant liquid passage 52 therethrough. The passage 52 through the gas input manifold 54 preferably comprises one or more holes drilled through the gas input manifold in close proximity to the gas passages 80, 82.

Figure 1:
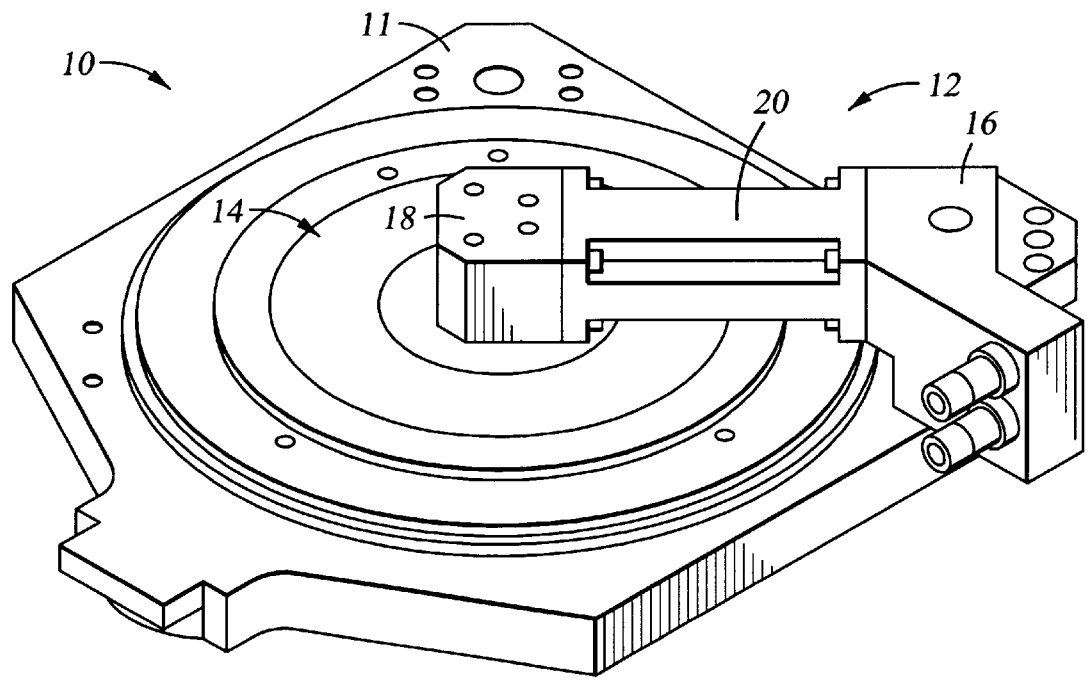
FIG. 1 is a perspective view of the lid portion of a CVD chamber which includes the temperature controlled gas distribution plate of the present invention therein.
Figure 6:
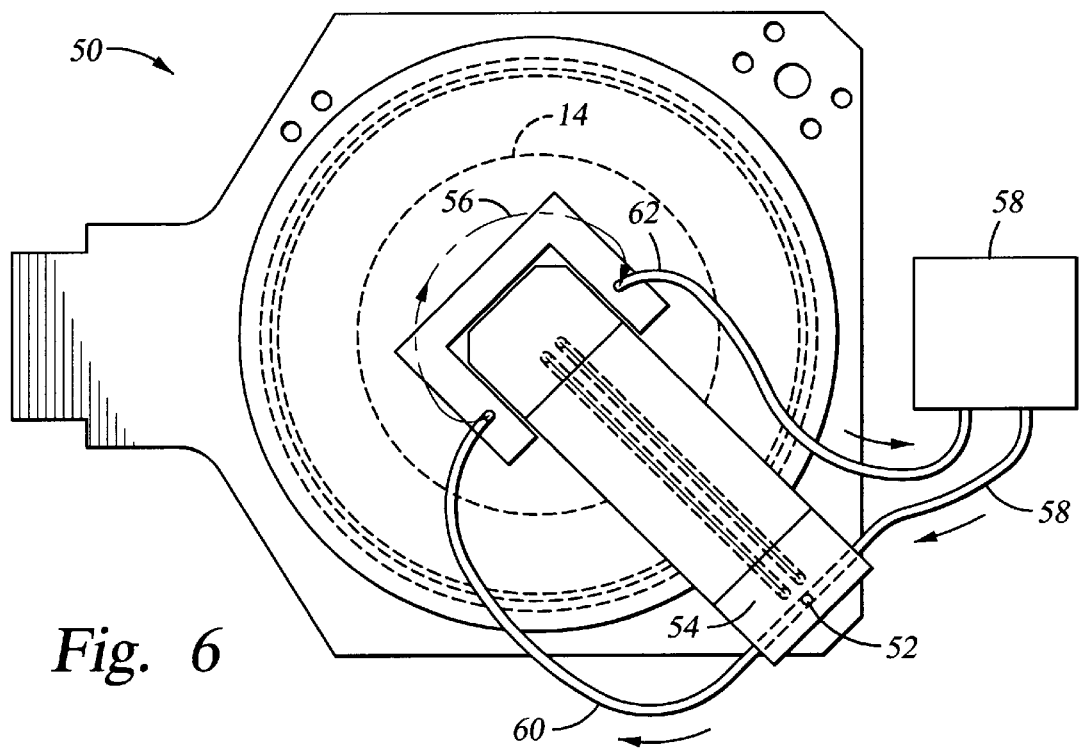
FIG. 6 is a schematic flow diagram of a gas delivery system of the present invention.
Figure 10:
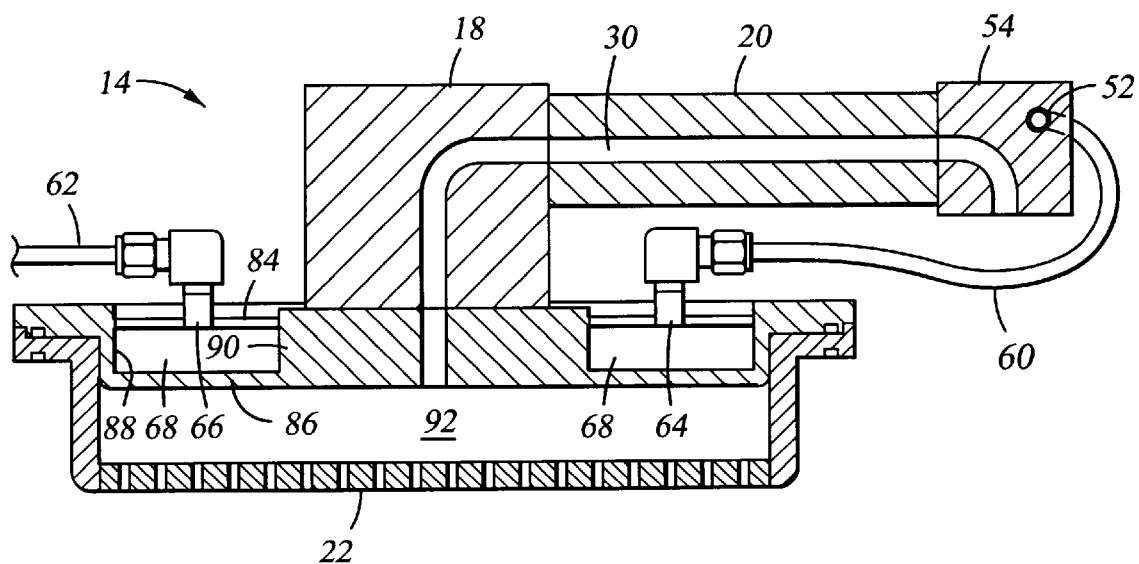
FIG. 10 is a cross-sectional view of the gas box of FIG. 1 in accordance with the cooling system of FIG. 6 of the present invention.

FIG. 10 is a cross-sectional view of the gas box 14 of FIG. 1 in accordance with the cooling system 50 of FIG. 6 of the present invention. The passage comprising the coolant liquid pool 68 may be a chamber defined between two parallel plates 84, 86 and inner and outer cylindrical walls 88, 90, perhaps disposed above or below some portion of the chamber 92 of the gas box 14.

Figure 9:
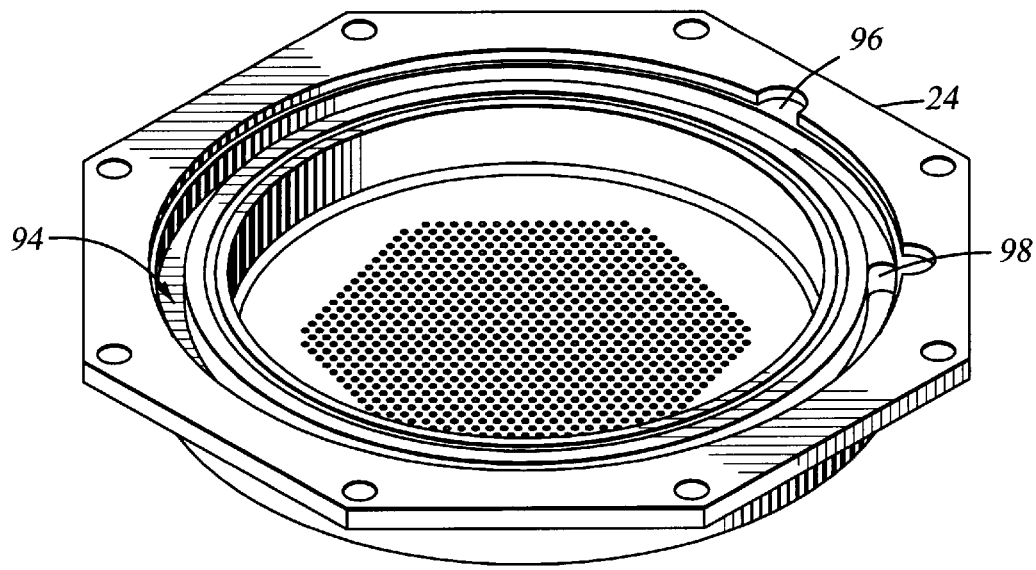
FIG. 9 is a perspective view of a gas distribution plate having an annular coolant liquid passage formed around its circumference.

FIG. 9 is a perspective view of a gas distribution plate 24 having an annular coolant liquid passage 94 formed around its circumference. Coolant liquid may be provided to a coolant liquid channel, such as a sealed annular groove 94, disposed in a chamber wall, ring member or lid around the circumference of the gas box or gas distribution plate 24. Flexible tubing, such as plastic or rubber hose, may be used to deliver and transfer the coolant fluid to and between the passages. Not shown in FIG. 9 is a mating ring which seals the top of the groove 94, but providing an inlet port 96 and outlet port 98 communicating with the groove 94.

Each of the cooling systems of the present invention provide improved thermal management of gas delivery systems to chemical vapor deposition chambers. Thermal management or temperature control of the gases is often necessary or desirable to prevent side reactions or undesirable deposition within the gas delivery system.

In yet another aspect of the invention, a gas injection manifold having a gas input manifold, a constant voltage gradient passthrough and a gas output manifold are provided with a cooling liquid passage through the gas input manifold and a bypass member coupled to the coolant liquid passage for bypassing the constant voltage gradient gas feedthrough. This bypassing member allows maintenance and disassembly of the constant voltage gradient gas feedthrough without breaking the seal on the coolant liquid system. In one embodiment, the bypass has a second end coupled to a coolant pool in the gas box or a channel in the gas distribution plate.

FIG. 6 is a perspective view showing a gas delivery system 50 for a chemical vapor deposition chamber of the present invention. A liquid coolant is provided to a coolant liquid passage 52 within the gas input manifold 54 and may optionally be passed into a coolant pool 56 adjacent the gas box 14 or gas distribution plate 24 (see FIG. 2). These coolant liquid passages 52, 56 are coupled to a heat exchange fluid source 58 which provides a fluid at a desired temperature. As shown in FIG. 6, the preferred means for delivering the fluid to and from the cooling passages is using conduits 58, 60, 62 such as a flexible hose, e.g., plastic or rubber hose. While the cooling passages 52, 56 may be operated in series or in parallel, it is generally preferred that the cooling fluid pass through the gas input manifold passages 52 and the coolant pool 56 in series, most preferably in that order since the magnitude of heat transfer occurring in the gas input manifold 54 will typically be much less than the heat transfer occurring between the coolant pool 56 and either the gas box or gas distribution plate.

Figure 7:
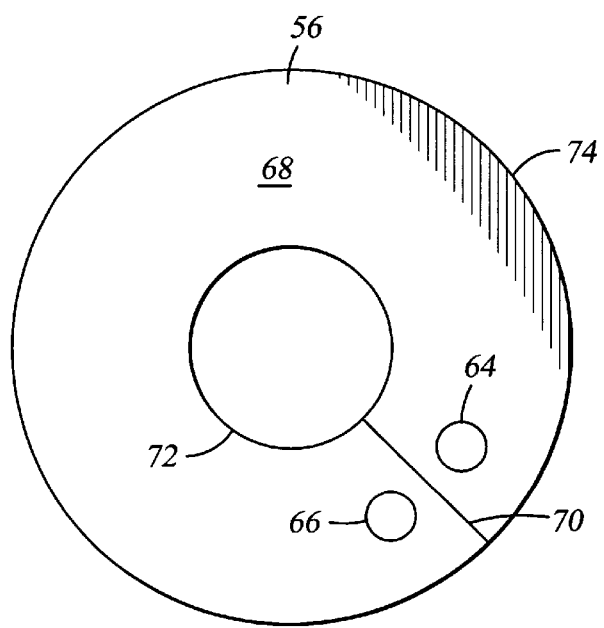
FIG. 7 is a schematic top view a coolant liquid pool.

FIG. 7 is a schematic top view of a coolant liquid pool 56. The liquid pool 56 includes an inlet port 64 and an outlet port 66 to a substantially annular chamber 68. In accordance with the invention, it is preferred that the annular chamber 68 include a radially disposed wall 70 extending from the inner annular surface 72 to the outer annular surface 74. This wall 70 forces the coolant fluid to take a long arcuate path through the pool 56 before exiting the coolant liquid outlet port 66. As shown, the coolant liquid inlet and outlet ports 64, 66 are preferably disposed adjacent opposing sides of the wall 70. It should be recognized that other walled arrangements may be provided to increase the circulation of fluid. It is anticipated that these walls could include spirals, serpentines, and the like without departing from the scope of the present invention.

The coolant liquid used in the present invention may be provided by any known system which can provide liquid at a desired temperature. Particularly, the system may include heat exchangers, either dedicated or centralized, that provide a continuous supply of the coolant liquid at a relatively constant temperature. These systems are typically located outside the clean room environment and may include continuous circulation loops providing coolant liquid to a plurality of devices.

While the foregoing is directed to a preferred embodiment of the present invention, other and further embodiments of the invention may be devised without departing from the basic scope thereof, and the scope thereof is determined by the claims which follow.

We claim:

1. A gas injection manifold for use in a chemical vapor deposition chamber, comprising:

a gas input manifold having first gas passages therethrough;

a gas output manifold having second gas passages therethrough; and a constant voltage gradient gas feedthrough having third gas passages therethrough wherein a first end of the constant voltage gradient gas feedthrough is detachably connected to the gas input manifold and a second end is detachably attached to the gas output manifold so that the first, second and third gas passages fluidly communicate with one another;

wherein the gas input manifold comprises a first coolant passage that is formed solely within the gas input manifold.

2. The gas injection manifold of claim 1, wherein the first coolant passage is self-contained within the gas input manifold.

3. The gas injection manifold of claim 1, further comprising a second coolant passage formed through the gas output manifold.

4. A gas distribution system for a chemical vapor deposition chamber, comprising:

a gas input manifold;

a gas output manifold;

a constant voltage gradient gas feedthrough coupled between the gas input manifold and the gas output manifold;

a gas box coupled to the gas output manifold and having a blocker plate;

a gas distribution plate disposed below the blocker plate;

a gas passageway extending through the gas input manifold, through the constant voltage gradient gas feedthrough, through the gas output and manifold, and into the gas box; and a cooling fluid channel formed solely within the gas input manifold.

5. The gas delivery system of claim 4 further comprising a coolant fluid pool disposed in thermal communication with the gas box.

6. The gas delivery system of claim 4 further comprising a coolant fluid pool disposed in thermal communication with the gas distribution plate.

7. The gas delivery system of claim 5 wherein the coolant fluid channel within the gas input manifold comprises a fluid inlet and a fluid outlet, and further comprising a first and second conduit coupled to fluid inlet and outlet, respectively and the coolant fluid pool.

8. The gas delivery system of claim 6 wherein the coolant fluid channel within the gas input manifold comprises a fluid inlet and a fluid outlet, and further comprising a first and second conduit coupled to fluid inlet and outlet, respectively and the coolant fluid pool.

9. The gas delivery system of claim 4 wherein the input and output gas manifolds are made of metal.

10. The gas delivery system of claim 7 wherein the fluid liquid coolant pool defines a substantially annular channel.

11. The gas delivery system of claim 8 wherein the fluid coolant pool defines a substantially annular chamber.

12. The gas delivery system of claim 11 further comprising:

a radially disposed wall disposed in the coolant liquid pool between an inner annular surface and an outer annular surface; and a coolant fluid inlet port and a coolant fluid outlet port, wherein the coolant fluid inlet port and the coolant fluid outlet port are on opposing sides of the wall and communicate with the first and second conduits, respectively.

13. The gas delivery system of claim 4, characterized in that the constant voltage gradient gas feedthrough may be detached without opening the coolant liquid channel.

* * * * *

UNITED STATES PATENT AND TRADEMARK OFFICE
CERTIFICATE OF CORRECTION

PATENT NO. : 5,968,276
DATED : October 19, 1999
INVENTOR(S) : Lei et al.

It is certified that error appears in the above-identified patent and that said Letters Patent is hereby corrected as shown below:

In column 2, line 17, after " Del" , please insert " )" .

In column 8, line 19, before " coolant" , please delete

" liquid" .

Signed and Sealed this

Seventh Day of November, 2000

Attest:

Q. TODD DICKINSON

*Attesting Officer*     *Director of Patents and Trademarks*